(12) United States Patent
Garrett, Jr. et al.

(10) Patent No.: US 6,462,591 B2
(45) Date of Patent: Oct. 8, 2002

(54) SEMICONDUCTOR MEMORY DEVICE HAVING A CONTROLLED OUTPUT DRIVER CHARACTERISTIC

(75) Inventors: Billy Wayne Garrett, Jr., Mountain View; John B. Dillon, deceased, late of Palo Alto, both of CA (US); by Nancy David Dillon, Marshall, VA (US); Michael Tak-Kei Ching, Sunnyvale, CA (US); William F. Stonecypher; Andy Peng-Pui Chan, both of San Jose, CA (US); Matthew M. Griffin, Mountain View, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/882,420

(22) Filed: Jun. 14, 2001

(65) Prior Publication Data

US 2002/0017929 A1 Feb. 14, 2002

Related U.S. Application Data

(63) Continuation of application No. 09/559,115, filed on Apr. 26, 2000, now Pat. No. 6,294,934, which is a continuation of application No. 09/141,675, filed on Aug. 27, 1998, now Pat. No. 6,094,075.
(60) Provisional application No. 60/073,353, filed on Feb. 2, 1998, and provisional application No. 60/057,400, filed on Aug. 29, 1997.

(51) Int. Cl.$^7$ ............................................... H03B 1/00
(52) U.S. Cl. ....................................................... 327/112
(58) Field of Search ............................... 327/77, 88, 89, 327/112, 534, 535, 537, 538, 540, 543

(56) References Cited

U.S. PATENT DOCUMENTS 3,646,329 A  2/1972  Yoshino et al. ........... 235/150.1
4,192,005 A  3/1980  Kurtz ........................... 364/571
4,315,210 A  2/1982  Michel et al. ................. 324/57
4,329,600 A  5/1982  Stewart ........................ 307/540
4,414,480 A  11/1983  Zasio ........................... 307/443

(List continued on next page.)

FOREIGN PATENT DOCUMENTS

EP    0482392    2/1991    ........... H04L/25/08

OTHER PUBLICATIONS

Sasaki, H., et al., "High–Precision Automated Resistance Measurement Using A Modified Wheatstone Bridge," CPEM '88 Digest, Japan, 1988, 1 page.
Sasaki, H., et al., "Measurement of the Pressure Dependence of Standard Resistors Using A Modified Wheatstone Bridge," Trans. IEE of Japan, vol. 109, No. 1/2, Jan./Feb. 1989, 6 pages.
Sasaki, H., et al., "Automated Measurement System for 1–Standard Resistors Using A Modified Wheatstone Bridge," IEEE Trans. on Instr. and Measurement, vol. 40, No. 2, Apr.1991, p. 274–277.

(List continued on next page.)

*Primary Examiner*—Jeffrey Zweizig
(74) *Attorney, Agent, or Firm*—Jose G. Moniz

(57) ABSTRACT

A semiconductor memory device including an array of memory cells. The memory device includes a first output driver coupled to a first output terminal, and a second output driver coupled to a second output terminal. The memory device further includes a voltage divider coupled between the first and second output terminals, to generate a control voltage based on a voltage level present on the first output terminal and a voltage level present on the second output terminal. The memory device further includes a comparator, coupled to the voltage divider, to compare the control voltage with a reference voltage, wherein an amount of voltage swing of the first output driver is adjusted based on the comparison between the control voltage and the reference voltage.

41 Claims, 12 Drawing Sheets

U.S. PATENT DOCUMENTS

| | | | |
|---|---|---|---|
| 4,549,124 A | 10/1985 | Beier | 318/663 |
| 4,560,921 A * | 12/1985 | Yamatake | 323/316 |
| 4,680,487 A | 7/1987 | Kobayashi | 307/475 |
| 4,691,127 A | 9/1987 | Huizer | 307/475 |
| 4,707,620 A | 11/1987 | Sullivan et al. | 307/270 |
| 4,715,003 A | 12/1987 | Keller et al. | 364/571 |
| 4,719,369 A | 1/1988 | Asano et al. | 307/443 |
| 4,728,881 A | 3/1988 | Evans et al. | 323/353 |
| 4,765,188 A | 8/1988 | Krechmery et al. | 73/708 |
| 4,779,013 A | 10/1988 | Tanaka | 307/443 |
| 4,859,877 A | 8/1989 | Cooperman et al. | 307/443 |
| 4,860,198 A | 8/1989 | Takenaka | 364/200 |
| 4,894,562 A | 1/1990 | Cavaliere et al. | 307/455 |
| 4,939,389 A | 7/1990 | Cox et al. | 307/443 |
| 4,958,520 A | 9/1990 | Trommler et al. | 73/727 |
| 4,967,105 A | 10/1990 | Akamatsu et al. | 307/448 |
| 4,977,333 A | 12/1990 | Suzuki et al. | 307/243 |
| 4,992,724 A | 2/1991 | Hisanaga et al. | 323/367 |
| 5,023,488 A | 6/1991 | Gunning et al. | 307/475 |
| 5,024,101 A | 6/1991 | Tanaka et al. | 73/766 |
| 5,045,730 A | 9/1991 | Cooperman et al. | 307/475 |
| 5,045,832 A | 9/1991 | Tam | 338/334 |
| 5,055,715 A | 10/1991 | Inaba | 307/443 |
| 5,075,569 A | 12/1991 | Branson | 307/270 |
| 5,081,379 A | 1/1992 | Korteling | 307/530 |
| 5,097,148 A | 3/1992 | Gabara | 307/443 |
| 5,107,230 A | 4/1992 | King | 333/32 |
| 5,117,130 A | 5/1992 | Shoji | 307/443 |
| 5,118,971 A | 6/1992 | Schenck | 307/443 |
| 5,121,064 A | 6/1992 | Eller | 324/601 |
| 5,134,311 A | 7/1992 | Biber et al. | 307/270 |
| 5,165,046 A | 11/1992 | Hesson | 307/270 |
| 5,185,538 A | 2/1993 | Kondoh et al. | 307/270 |
| 5,194,765 A | 3/1993 | Dunlop et al. | 307/443 |
| 5,206,546 A | 4/1993 | Usami | 307/443 |
| 5,237,214 A | 8/1993 | Usami | 307/454 |
| 5,254,883 A | 10/1993 | Horowitz et al. | 307/443 |
| 5,296,756 A | 3/1994 | Patel et al. | 307/443 |
| 5,387,824 A | 2/1995 | Michelsen | 326/83 |
| 5,457,407 A | 10/1995 | Shu et al. | 326/30 |
| 5,546,042 A | 8/1996 | Tedrow et al. | 327/538 |
| 5,568,068 A | 10/1996 | Ota et al. | 326/82 |
| 5,578,960 A * | 11/1996 | Matsumura et al. | 323/276 |
| 5,596,285 A | 1/1997 | Marbot et al. | 326/30 |
| 5,668,468 A * | 9/1997 | Cargill | 323/316 |
| 5,838,177 A | 11/1998 | Keeth | 327/108 |
| 5,945,819 A * | 8/1999 | Ursino et al. | 323/282 |
| 5,977,797 A | 11/1999 | Gasparik | 326/86 |
| 6,072,747 A | 6/2000 | Yoon | 365/230.6 |
| 6,087,893 A * | 7/2000 | Oowaki et al. | 327/537 |

OTHER PUBLICATIONS

Sasaki, H., et al., "A Modified Wheatstone Bridge for High–Precision Automated Resistance Measurement," IEEE Trans. on Instr. and Measurement, vol. 26, No. 2, Dec. 1987, p. 947–949.

Senbon, T and Hanabuchi, F., *Instrumentation Systems: Fundamentals and Applications*, Chapter 3: Detection and Conversion of Industrial Variables: 1991, 11 pages.

Johnson, C. and Richeh, H., "Highly Accurate Resistance Deviation to Frequency Converter with Programmable Sensitivity and Resolution," IEEE vol. IM–35, No. 2, Jun. 1986, 4 pages.

Raver, Norman, "Open–Loop Gain Limitations for Push–Pull Off–Chip Drivers," Journal of Solid–State Circuits, vol. SC–22, No. 2, Apr. 1987, pp. 145–150.

Armstrong, David H., "Pitfalls in Testing Digital ASIC Devices," IEEE 1987 Custom Integrated Circuits Conference, pp. 573–578.

Matthews, John W. and Erdelyi, Charles K., "Power Supply Voltages for Future VLSI", IEEE 1986 Custom Integrated Circuits Conference, pp. 149–152.

Reynolds, C.B., "Analysis and Guidelines for High–Speed VLSI System Interconnections," IEEE 1988 Custom Integrated Circuits Conference, pp. 23.5.1–23.5.4.

Leung, Kam, "Controlled Slew Rate Output Buffer," IEEE 1988 Custom Integrated Circuits Conference, pp. 5.5.1–5.5.4.

Knight, Thomas F. Jr., and Krymm, Alexander, "A Self–Terminating Low–Voltage Swing CMOS Output Driver," Journal of Solid State Circuits, vol. 23, No. 2, Apr. 1988, pp. 457–464.

Cox, Dennis T., et al., "VLSI Performance Compensation for Off–Chip Drivers and Clock Generation," IEEE 1989 Custom Integrated Circuits Conference, pp. 14.3.1–14.3.4.

Douseki, Takakuni and Ohmori, Yasuo, "BiCMOS Circuit Technology for a High–Speed SRAM," IEEE Journal of Solid–State Circuits, vol. 23, No. 1, Feb. 1988, pp. 68–73.

"Driver with Noise–Dependent Switching Speed Control," IBM Technical Disclosure Bulletin, vol. 29, No. 3, Aug. 1986, IBM Corporation, pp. 1243–1244.

Biber, Alice I. "The Design of an Application Specific Interface Driver for a High Capacitive Load," Masters Thesis at the Massachusetts Inst. of Technology, Dec. 1989.

* cited by examiner

Block Diagram of Current Control Circuitry.

Current Control Counter with TestModes

Current Control Logic Diagram

SEMICONDUCTOR MEMORY DEVICE HAVING A CONTROLLED OUTPUT DRIVER CHARACTERISTIC

This is a continuation of application Ser. No. 09/559,115, filed Apr. 26, 2000, U.S. Pat. No. 6,294,934, which is a continuation of application Ser. No. 09/141,675, filed Aug. 27, 1998, U.S. Pat. No. 6,094,075, which claims priority to the provisional patent application entitled "Current Control Circuit", Ser. No. 60/073,353, filed Feb. 2, 1998, and the provisional patent application entitled "Current Control Technique", Ser. No. 60/057,400, filed Aug. 29, 1997.

BACKGROUND OF THE INVENTION

1. Field of the Invention

The present invention relates to the field of integrated circuits and high-speed buses. More specifically, the present invention relates to a circuit for a high-speed driver and techniques for obtaining rapid switching speed with low power consumption and low noise on high-speed buses.

2. Description of the Related Art

To obtain rapid switching speed on a bus with low power consumption and low noise, it is desirable for a current mode driver to set and control the current at which the driver operates. U.S. Pat. No. 5,254,883, assigned to the assignee of the present invention, and incorporated herein by reference, discusses an apparatus and method for setting and maintaining the operating current of a current mode driver for a bus. Essentially, for a bus with a master-slave architecture, there are two problems to be solved in setting the operating current on the bus. First, the operating current of the master's current mode drivers should be properly set. Second, the operating current of the slave's current mode drivers should be properly set. Once these currents are set, they are maintained at those settings despite process, voltage and temperature variations by circuitry in the master and slave devices.

A master-slave bus architecture is discussed in the '883 patent in which a master may send data to and receive data from a slave. A slave may send data to and receive data from a master, but not another slave. The master sets its operating current for its drivers and each slave sets the operating current for its drivers.

The master employs an adjustable current sink as a driver for each bus line that it drives. The current sink turns or to drive the voltage on the bus line, $V_{out}$, to a voltage closer to ground and turns off to allow a termination resistor, $R_{term}$, on the bus line to pull the bus line closer to the terminator voltage, $V_{term}$. The current in the driver, $I_d$, is set by a digital counter whose count is determined from a feedback circuit having a comparator. If the count is all zeros then no current flows in the driver and the voltage on the bus line, $V_{out}$, is the termination voltage, $V_{term}$. If the count is all ones, then the maximum current flows in the driver and the voltage on the bus line, $V_{out}$, equals $V_{term} - I_d * R_{term}$.

The feedback circuit compares a voltage reference, $V_{ref}$, to a node voltage, $V_n$, derived from a scaled reference driver which receives the count from the counter. Feedback assures that the node voltage matches the reference voltage, $V_n = V_{ref}$. When the match occurs the reference driver has an output swing (i.e., change in voltage) of $(V_{term} - V_{ref})$ and the actual output driver has a swing of $2*(V_{term} - V_{ref})$ due to the scaling between the reference driver and the actual output driver. Therefore, $V_{out}$ equals $(V_{term} - 2)*(V_{term} - V_{ref})$. Thus, by selecting a value for $V_{term}$ and $V_{ref}$ any size symmetric voltage swing about $V_{ref}$ may be achieved.

The slave in the '883 patent also employs an adjustable current sink as a driver for each bus line that it drives. A counter similarly controls the value of the current in the driver such that the driver may swing between $V_{term}$ and $V_{term} - I_d * R_{term}$, where $I_d$ is the current setting in the driver of the slave. However, the value in the counter is directly proportional to the value of an RC time constant whose capacitance, C, is set by the master. The master also determines whether the value of $V_{out}$ from the driver matches $V_{ref}$ in the master. It adjusts the RC time constant so that the count in the counter will set a current in the driver and $V_{out}$ will match $V_{ref}$. Thus $V_{out}$ will equal $V_{term} - (V_{term} - V_{ref})$. In order to produce a symmetric swing about $V_{ref}$ another step is required. The master should double the value of the RC time constant which will double the count. This will produce a $V_{out}$ which is equal to $V_{term} - 2*(V_{term} - V_{ref})$.

Maintenance of the current setting of the driver in the slave may be performed in a manner different from that in the master. In the slave, the effective R in the RC time constant is derived from a reference voltage and reference current. If due to variations in temperature or supply voltage, the reference current decreases then the effective R in the RC time constant increases. This increases the count and the operational current setting of the driver in the slave, thus compensating for the effect. If the reference current increases, the effective R and the count decrease, again compensating for the change.

While the above techniques of setting and maintaining operating current in the master and slave bus line drives have met with substantial success, the techniques are not without certain shortcomings. For example, the technique of setting the current in the master requires an extra pin dedicated to receive the external resistor. Another shortcoming is selecting the proper value of the external resistor to maintain the factor of two scaling between $(V_{term} - V_n)$ and $(V_{term} - V_{out})$. If the scaling is not precisely set, the output swing is not symmetric about $V_{ref}$. Further, as process, voltage, or temperature variations occur, the value selected for the resistor may not be ideal. A further shortcoming is that an electrostatic discharge structure (ESD): in series with the pin receiving the external resistor adds a variable amount of resistance in series with the external resistor. This makes the selection of the external resistance subject to variations in the ESD structure.

Further, a shortcoming in the technique of setting the current in the slave is that a relatively complex algorithm between the slave and the master is required to correctly set the current in the slave. The master sets the RC time constant which in turn determines the count and the output value. The master then tests the output value to determine whether it matches $V_{ref}$. If not, it increases the count and retests the output value. This cycle continues until a match occurs. However, a match of $V_{out}$ to $V_{ref}$ for one bus line, does not always insure that a match will occur on another bus line due to small differences in characteristics between output drivers, bus lines, and $V_{ref}$ comparison circuits.

As can be seen, an improved output driver circuit and techniques for obtaining rapid switching speed with low power consumption and low noise is needed.

SUMMARY OF THE INVENTION

The present invention includes a circuit and current control technique to enable high-speed buses with low noise. This circuitry may be used in the interfacing of high-speed dynamic RAMs (DRAMs). The architecture of the present invention includes the following components: an input isolation block (Isolation), an analog voltage divider (AVD), an input comparator, a sampling latch, a current control counter, and a bitwise output driver (output driver A and output driver B).

A fundamental operation of the current control mechanism is to evaluate the voltage levels $V_{hi}$, $V_{low}$, and $V_{ref}$, and increment or decrement the current control counter accordingly to set an appropriate output level. When the current control circuitry is in an evaluation mode, output driver A is off (not sinking current), and node BDA is at the output high voltage level (typically $V_{term}$). Output driver B is active, and pulls node BDB to the low voltage output level. The voltage levels at nodes BDA and BDB are passed through the isolation block, and fed into the analog voltage divider. The analog voltage divider outputs a voltage level which is a weighted average of it's input. I.e., $V_{out}=(A*V_{hi})+(B*V_{low})$. For example, in a specific case, $V_{out}=(0.5*V_{hi})+(0.5*V_{low})$.

The input comparator compares $V_{out}$ and $V_{ref}$ and generates an up signal. The up signal is sampled, and used to increment or decrement the current control value held in the current control counter. By repeating this process the current control value will settle to a value where $Vol=(V_{ref}-A*V_{term})/B$.

When the current control circuity is not active, the input isolation block shields any interactions of the analog voltage divider circuitry and the output pad.

The output driver is composed of a series of individual output transistors, an example of which is shown in FIG. 4. The number of active output transistor blocks are selected with control signal ictrl[n:O]. The width of the output devices may be scaled in a geometric fashion to allow encoding of the ictrl[n:O] signal.

The input isolation gates may be implemented as CMOS pass gates, NMOS passgates with boosted gate voltages, unity gain buffers, or operational amplifiers (op amps). The analog voltage divider may be implemented with a resistor divider, a digital-to-analog converter, or switched capacitor filter such as a sigma/delta modulator. The sampling latch may be implemented as a simple flip-flop or latch, or a series of sequential elements with logic to average the sampled value. The current control counter may be implemented as an up-down counter or a more sophisticated counter such as a saturating binary search counter.

Other objects, features, and advantages of the present invention will become apparent upon consideration of the following detailed description and the accompanying drawings, in which like reference designations represent like features throughout the figures.

DESCRIPTION OF THE PREFERRED EMBODIMENTS

Figure 1:
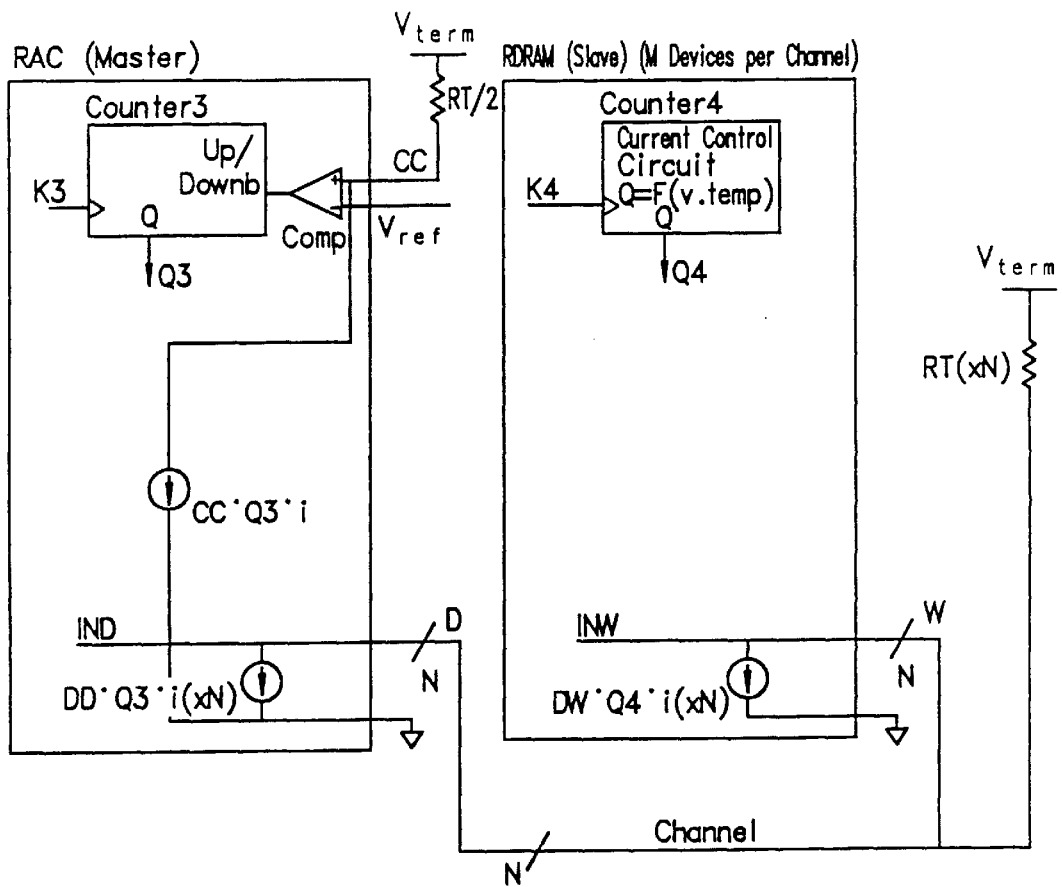
FIG. 1 illustrates a prior art implementation of a current control circuit having a master device and slave device.

The present invention provides an improved apparatus and method of setting the current in master and slave devices connected to a common bus. FIG. 1 is a block diagram of a current control implementation with a master device (RAC) and a slave device (RDRAM), in accordance with the prior art. FIG. 1 is simplified to display only a single slave device RDRAM, however it should be appreciated that many slave devices may be used in connection with the master device RAC.

In accordance with the prior art, the master device RAC has a dedicated output pin CC. The output pin CC is connected to a termination voltage $V_{term}$ through a resistor $R_{term}/2$. If the output driver is an ideal current source, then the voltage output will be the middle of the swing. This value is compared to $V_{ref}$ and adjusted up or down accordingly.

For the slave device RDRAM, there is a circuit that indirectly infers the amount to adjust the output current depending on variations of voltage and temperature. The original proper value is established by running a current control initialization routine which requires reading data back through the master device and detecting the first time valid ones are transmitted on the bus. This threshold is discovered and then doubled (approximately) before being sent to the slave device.

The technique shown in FIG. 1 requires N+1 pins on the master device, and N pins on the slave device. The additional pin on the master device is required for the CC connection shown in FIG. 1. The device of FIG. 1 also requires the resistor RT/2 on the printed circuit board upon which the master device is mounted. Unfortunately, the RT/2 resistor may not have the desired value. The current produced by the output transistor varies slightly as the voltage changes, which means there are non-ideal effects of the V-I characteristics of the output transistor, such as channel length modulation. So although it is desirable for the current control resistor to be $R_{term}/2$, its value is more likely about $R_{term}/2.2$. The value also varies somewhat due to differences in process, vendor, and temperature.

Internal to the master device RAC, there is an input comparator COMP. The comparator compares $V_{ref}$ to the voltage on the current control pin (CC). If the voltage comparison determines the output is too low, then a counter (Counter3) is incremented, thereby increasing the current of all the output drivers on the chip (during the next current control cycle). If the current is too high, then the counter (Counter3) is subsequently decreased. By selecting the proper resistor (which is difficult to do), the current control circuit adjusts the output drive at regular intervals to keep the full voltage swing of the remaining pins. This then tracks any drift of the transistors due to voltage or temperature effects, allows for different process variations chip to chip, and provides many similar benefits. However, selecting the proper resistor value to achieve this result is difficult.

A further technique involves using an expansion mechanism referred to as "y-channel." However, this technique requires that the resistor value be changed (essentially halved) when the module is inserted, compared to the case when it is not inserted. This may be achieved by adding a parallel current control resistor to the one on the motherboard which essentially changes the parallel resistance so that the output current is doubled. Unfortunately, the non-linear nature of the transistors again requires that a "special" resistor value be calculated in order to double the current. Once the proper resistor value is found, automatic tracking is still assured using the expansion mechanism.

A consideration that needs to be addressed for some integrated circuits is that an electrostatic discharge (ESD) structure may be placed in series with the current control pin. This adds a variable amount of resistance, significant enough to change the needed external resistor value substantially. The resistance of such an ESD structure needs to be accounted for.

As known in the art, current control calibrations are performed during "quiet" times on the bus. That is, the current control calibrations are "scheduled" between activities on the bus.

Figure 2:
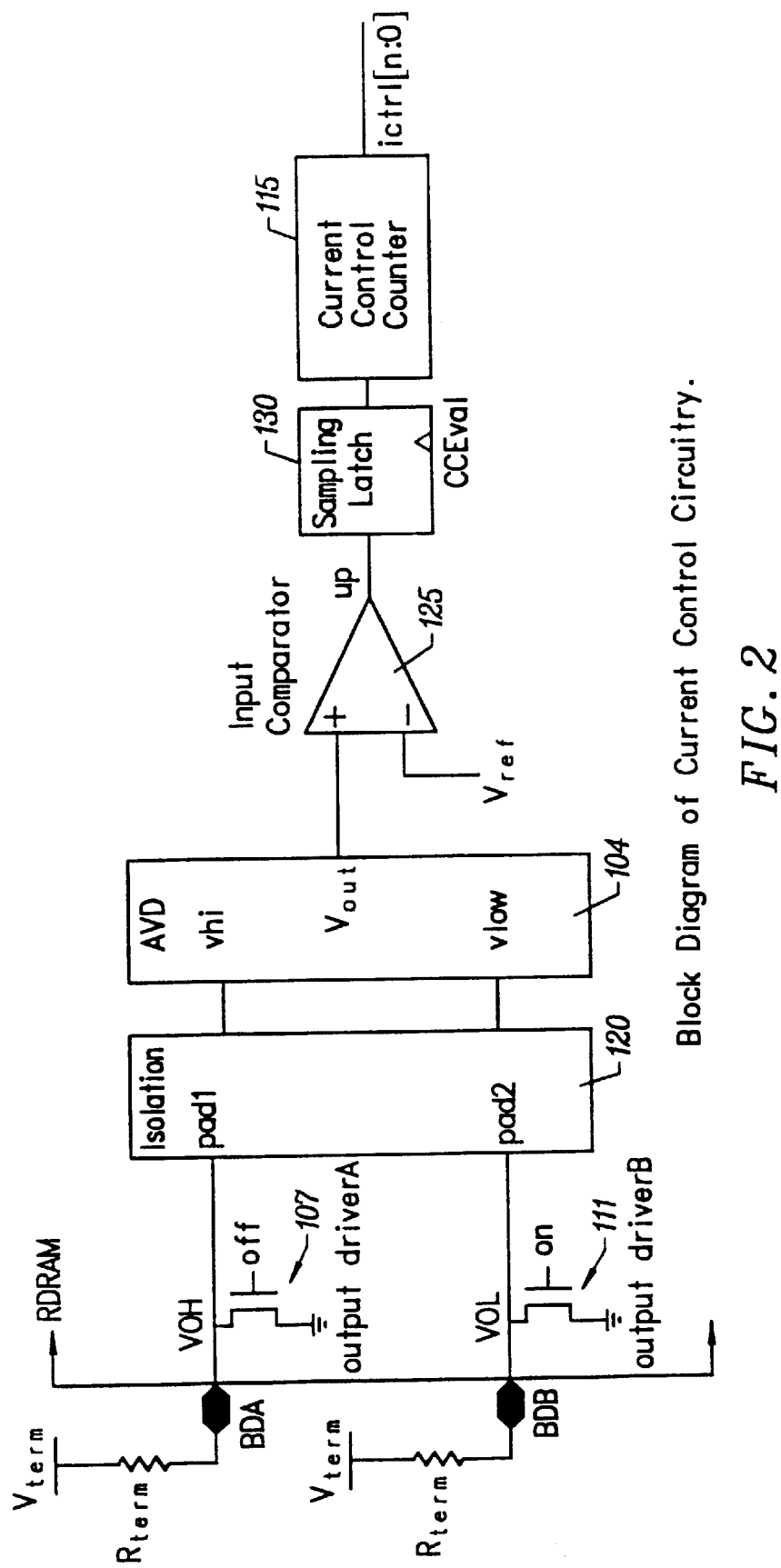
FIG. 2 shows a block diagram of current control circuitry in accordance with an embodiment of the present invention.
Figure 3:
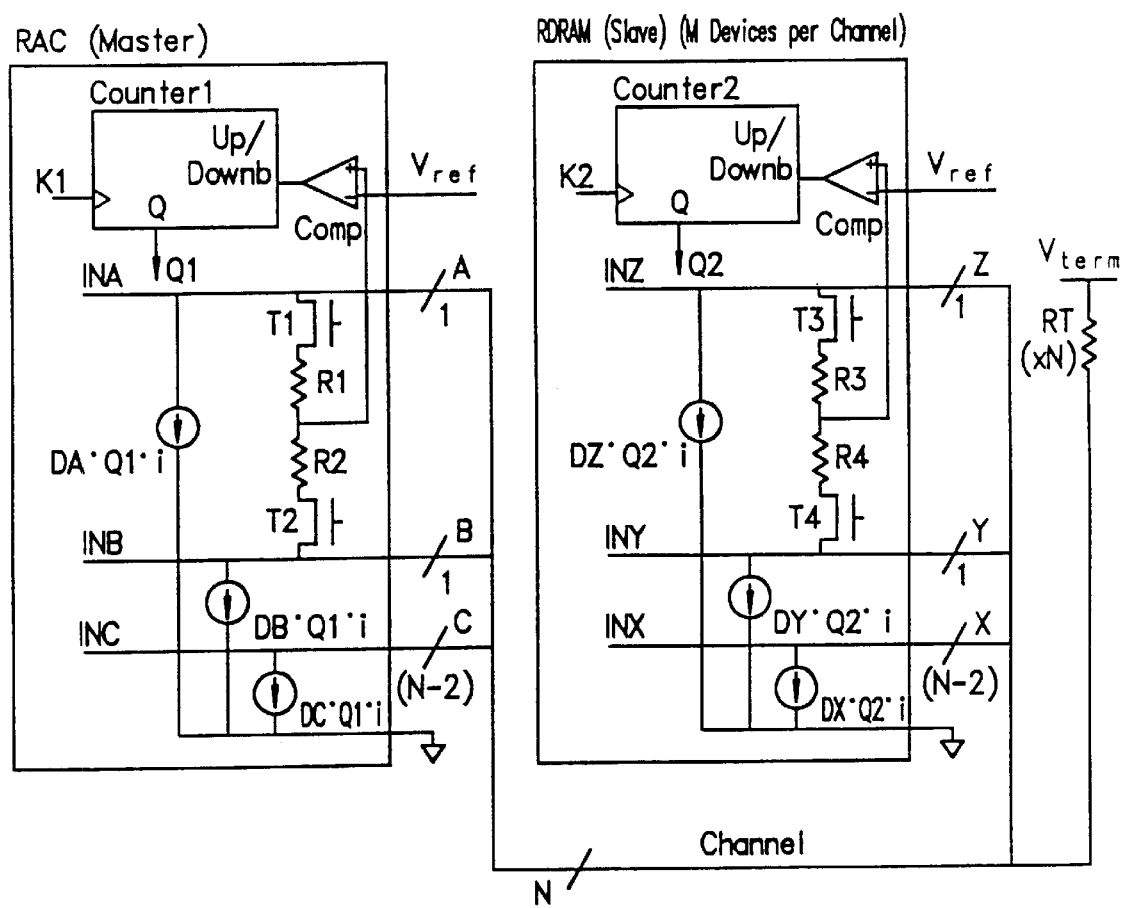
FIG. 3 illustrates current control circuitry in accordance with an embodiment of the present invention.
Figure 4:
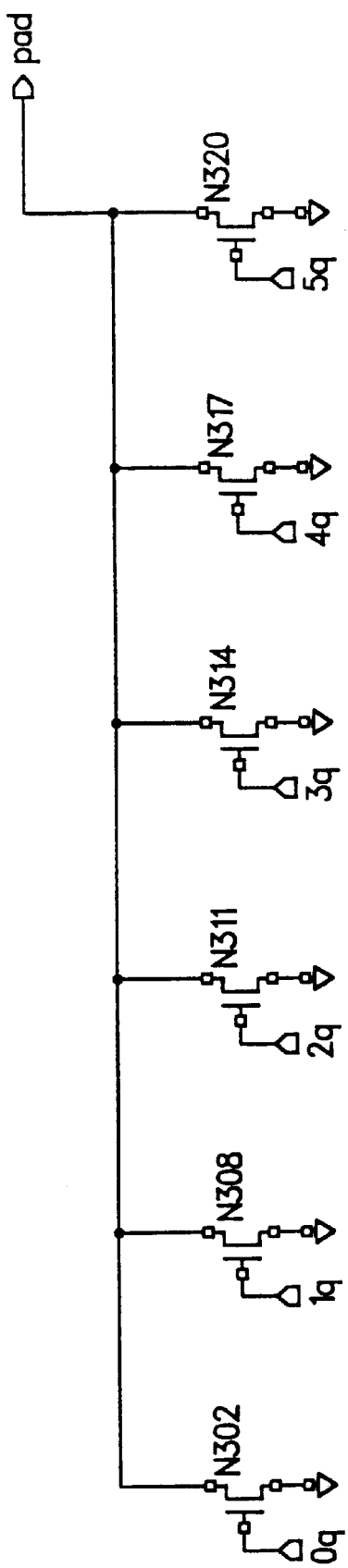
FIG. 4 illustrates an output driver which may be utilized in accordance with an embodiment of the invention.

FIG. 2 shows an overall diagram of an embodiment of the current control technique of the present invention. FIG. 3 is a schematic of the architecture utilized in accordance with the invention. FIGS. 4–8 show circuit schematics of a specific implementation of the present invention.

The circuit of FIG. 2 includes the following components: an input isolation block (Isolation) 120, an analog voltage divider (AVD) 104, an input comparator 125, a sampling latch 130, a current control counter 115, and a bitwise output driver (output driver A 107 and output driver B111).

As shown in connection with FIG. 1, the prior art relied upon an input comparator COMP in performing its current control functions. The present invention also uses an input comparator 125 for current control functions. However, unlike the prior art which received a control voltage from a dedicated external pin connected to a printed circuit board mounted resistor RT/2, the present invention uses a simple R over R resistive divider placed between an active output and a nonactive output. The output of the divider circuit is a voltage equal to $(V_{term}-V_{swing})/2$. This is exactly the value desired to compare against $V_{ref}$. It is desirable that these two are equal. If they are not, the current control circuit increments or decrements the counter and tracks any output current variations due to changes in current drive of the transistors (because of temperature or VDD changes).

The circuitry employs voltage divider circuitry 104 on both the master and slave devices. As shown in FIG. 2, the voltage divider circuitry is connected between bus drivers A and B, driver 107 and 111, respectively. This circuitry is activated when the operating current must be set in the bus drivers and deactivated when the bus drivers are used in normal operation.

Bus lines connected to the two selected drivers of the master are different from bus lines connected to the two selected drivers of the slave device. Consequently, the setting of an operating value of current in the master can proceed simultaneously with the setting of a value in the slave. If there are multiple slaves, each slave device may use bus drivers connected to a unique pair of bus lines so that the setting of the operating current in the several slaves may proceed concurrently. Preferably, all slave devices use the same pins.

A counter (e.g., 115) in the master and in the slave determines the value of the current in the current driver as discussed above. The count in the master and slave is determined by a feedback circuit which compares a voltage reference, $V_{ref}$, to a common node voltage, $V_{out}$, which is derived from the voltage divider circuitry. The feedback circuit assures, via the counter, that $V_{ref}$ is equal to $[V_{term}-(V_{term}-V_{out})/(1+\text{voltage divider ratio})]$ by adjusting current in a selected one of the drivers to which the voltage divider circuitry is connected. One of the drivers is left in the off condition, providing $V_{term}$ to the voltage divider. Thus, the common mode voltage swings a fixed amount equal to $(V_{term}-V_{ref})$ which is applied across the upper one of the resistors, R1 (FIG. 3), of the voltage divider when a resistive voltage divider is used. The lower one of the resistors, R2 (FIG. 3), has $g*(V_{term}-V_{ref})$ across it, where g is the voltage divider ratio. I.e., g=R2/R1 where R1 is connected between the off driver and the center node and R2 is connected between the center node and the on driver. Typical values for R1 and R2 are approximately 10 K ohms. Thus, $V_{out}$ equals $(1+g)*V_{ref}-g*V_{term}$. If the resistors are equal then g equals one and $V_{out}$ equals $2*V_{ref}-V_{term}$. For example, if $V_{term}$ is 1.8 volts and $V_{ref}$ is 1.4 volts, then $V_{out}$ is 1.0 volts and the swing, $V_{swing}$, of $V_{out}$ is 0.8 volts. Also, the current in the output driver is now $V_{swing}/R_{term}$, which equals 0.8 volts/ 28=28.6 milliamps. For example, $R_{term}$ may be about 28 ohms. Typically, $R_{term}$ may be in the range from about 20 ohms to about 50 ohms.

When the voltage divider circuit is activated, the circuit itself creates a source of voltage error, caused by the current that flows through the voltage divider circuit from $V_{term}$, through the termination resistor, through R1 and R2 and to the output driver which is in the on-state. This current causes the voltage of the driver in the off-state to be slightly less than $V_{term}$ say $e*V_{term}$, where e is a number close to one. Specifically, $e=1-[((V_{term}-V_{out})/V_{term})*(R_{term}/(R1+R2+R_{term}))]$. This current also causes the voltage of the driver in the on-state Lo be slightly higher than $V_{out}$ also by the same error term, say $e*V_{term}$. Therefore, using the suggested resistor values, e=0.998882 and $V_{out}$=1.002, so $V_{out}$ has a 2 millivolt error.

The feedback circuit assures that the common node of the voltage divider is locked to $V_{ref}$, so that the drop across R1 is $(e*V_{term}-V_{ref})$. The voltage drop across R2 is $e*V_{term}-V_{ref}$. The output voltage, $V_{out}$, is $2*V_{ref}-e*V_{term}$. So the output voltage is slightly higher than its value in the absence of the voltage divider. $V_{swing}$ is now $(1+e) V_{term}-2V_{ref}$ and the current in the output driver is $V_{swing}/R_{term}+(V_{term}*-e*V_{term})/R_{term}=2*(V_{term}-V_{ref})/R_{term}=30$ millilamps, as before. Thus, while the output voltage is altered slightly when the voltage divider circuit is activated, it does not affect the setting of current in the output driver or the counter value that controls that current.

Under ideal conditions the ratio of the resistors, g, is a precise value, such as unity. However, if some errors are present in the circuit, it is desirable to compensate for them by slightly altering the ratio. Some sources of error are currents into the comparator and hysteresis or offsets in the comparator. Another source of error is the circuitry used to activate the voltage divider circuitry, if the activation circuitry is in the form of pass gates in series with R1 and R2 of the voltage divider.

Alternatively, the error current that flows in the divider circuit may be negligible compared to the amount of current controlled by one half of the least significant bit of the counter, if the resistances in the divider can be made large enough. The value of $(V_{term}-e*V_{term})/R_{term}$ is approximately 0.15 milliamps. The amount of current flowing through the voltage divider is $[(V_{term}-V_{out})/(R1+R2+R_{term})]$ or typically about 0.04 mA. Seven bits controlling 28.6 milliamps makes 1/2LSB equal to 0.11 milliamps.

Another reason for altering the ratio, g, is that the edge rate for a rising signal may be different from a falling signal on the output of the bus driver. Altering the voltage divider ratio so that the swing is not symmetric about $V_{ref}$ may be necessary to obtain the best noise margin for receiving the signal on the bus.

In one embodiment the relationship between the counter value and the current in the driver is linear. Such a driver uses binary weighted output transistor legs to adjust the current in single steps from 0 to $2^N$ where N is the number of current control bits. In other embodiments there are other relationships between the counter value and current in the driver. For example, a logarithmic relationship can be used. This allows more precision with smaller count values and less precision with larger count values.

In another embodiment, the counter counts up until the proper current is reached. After the initial setting, the counter counts up or down to adjust the current in the driver. In another embodiment, more complex algorithms are employed to find the correct value for the count. One such algorithm is binary searching until a value close to the correct value is found and then counting up or down to obtain the precise value.

In a further embodiment, the feedback and counter circuit setting apply to all of the bus drivers of a device. In another embodiment there is a feedback and counter circuit for each or any number, 1-to-N, of the bus drivers of a device. This latter embodiment has the advantage that each driver is correctly set, but the disadvantage that more circuitry is required.

The setting of operating current in the bus driver can consume time on the bus, resulting in a loss of throughput. To eliminate this loss, in one embodiment, the setting of the current occurs during a period of time on the bus which cannot be used otherwise. If the slave devices are memory devices, that time is the time at which the memory devices are refreshed, which typically occurs every 16 microseconds for a duration of 80 ns. In some cases the setting of the operating current in the bus driver takes only about 20 ns, thus, the setting can occur concurrently with the refresh operation.

Figure 6:
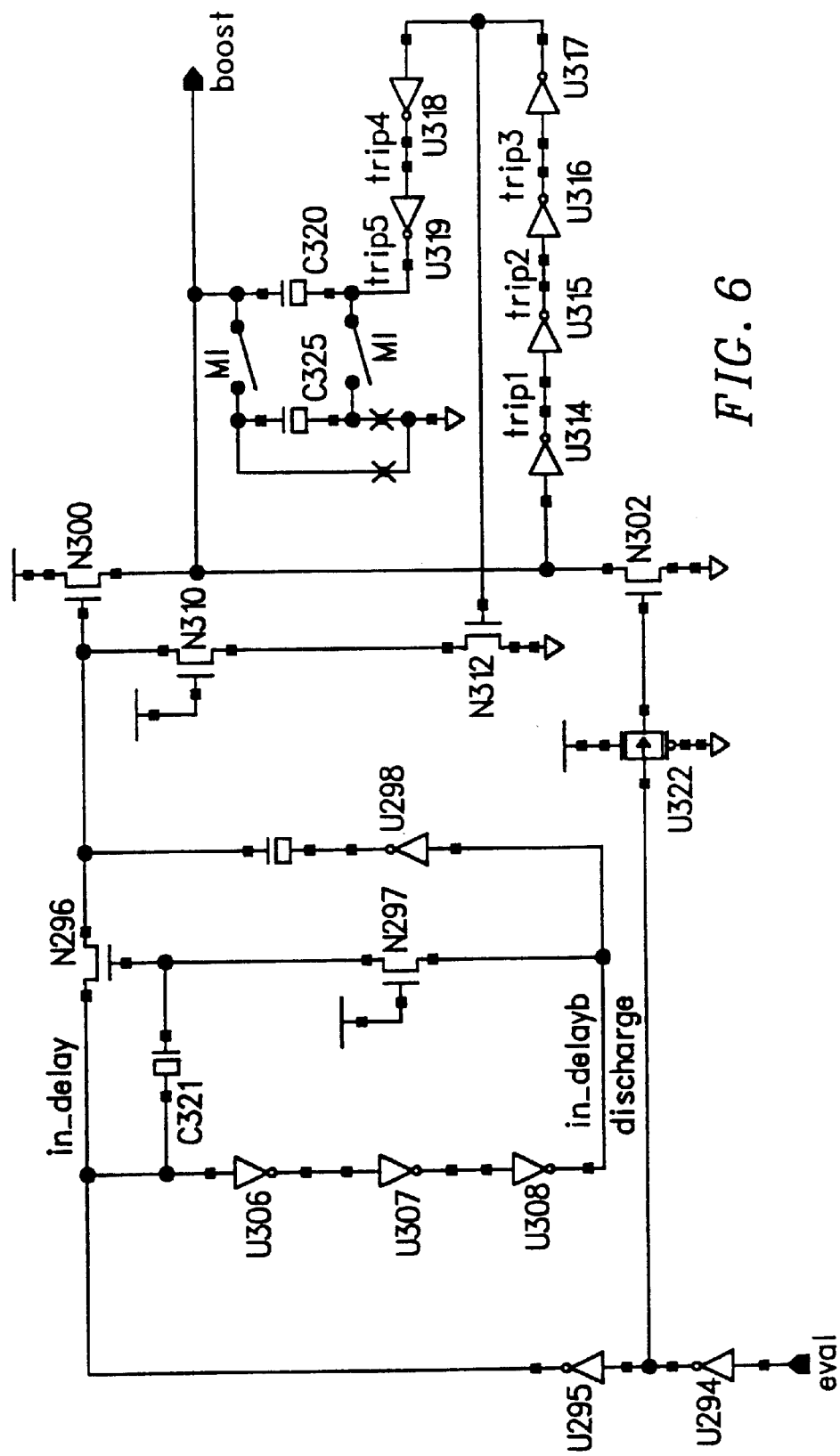
FIG. 6 shows circuitry for the gxCCbst1 element of FIG. 5, which may be used to generate a boosted voltage.
Figure 7A:
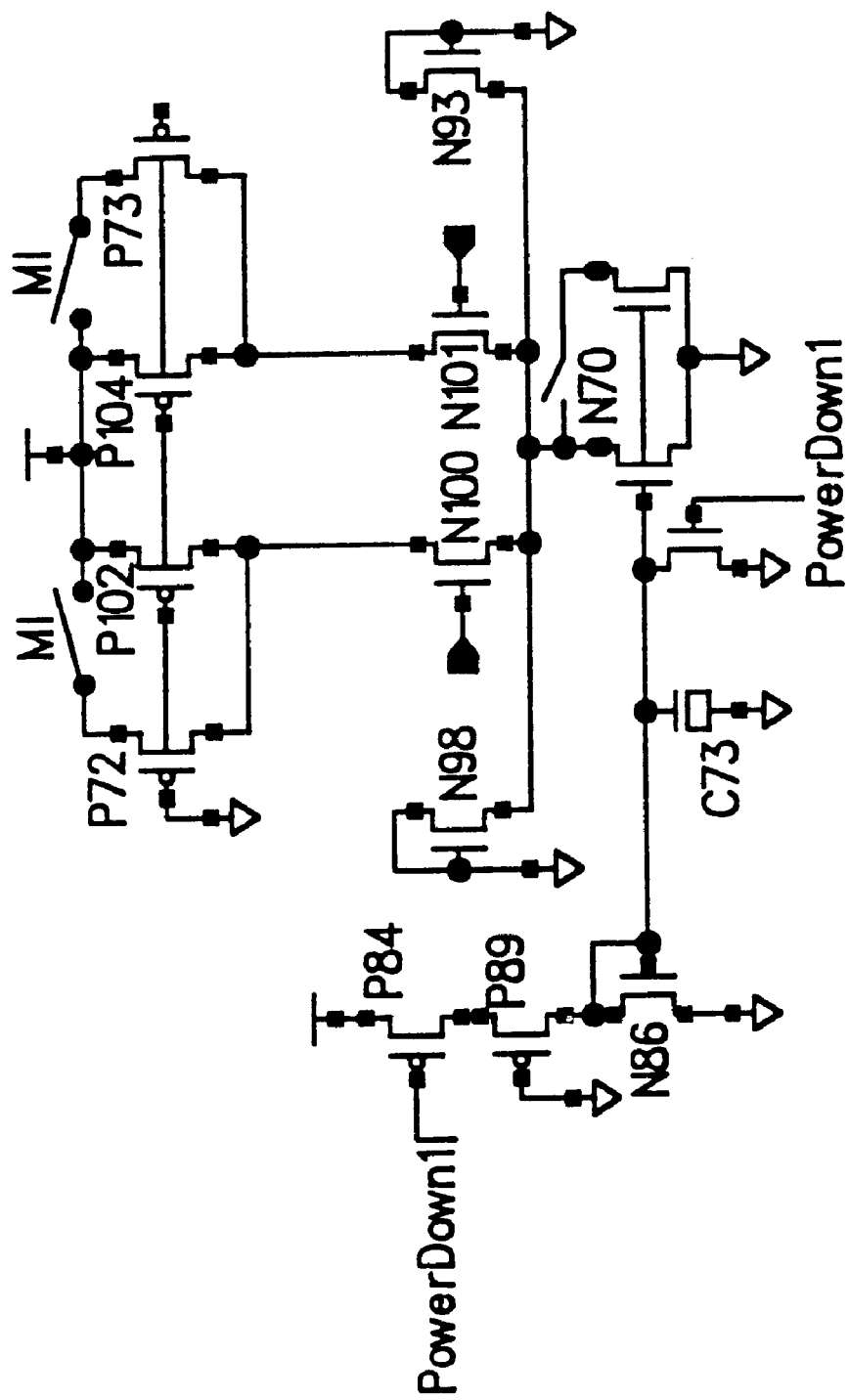
FIGS. 7A–7B show circuitry for an input comparator gxCComp of FIG. 5.
Figure 7B:
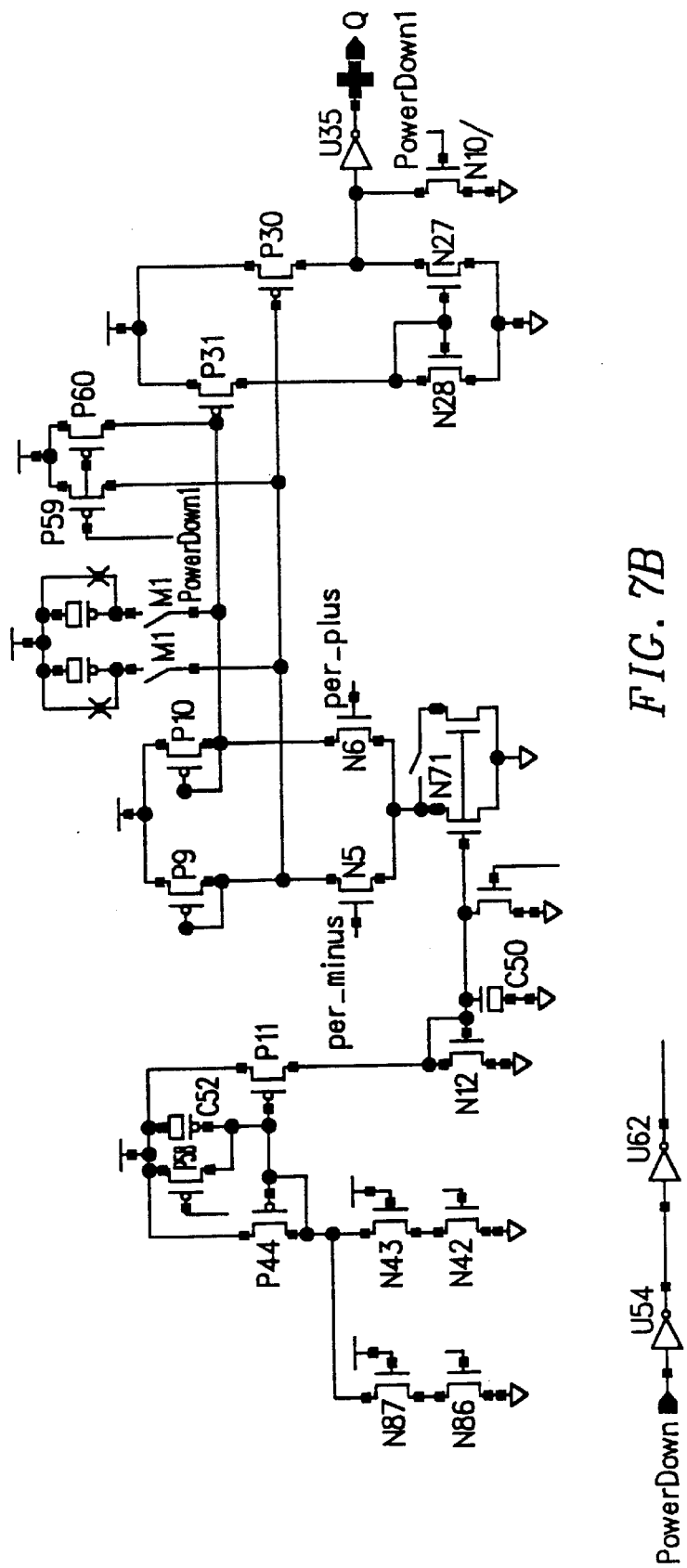
Figure 8:
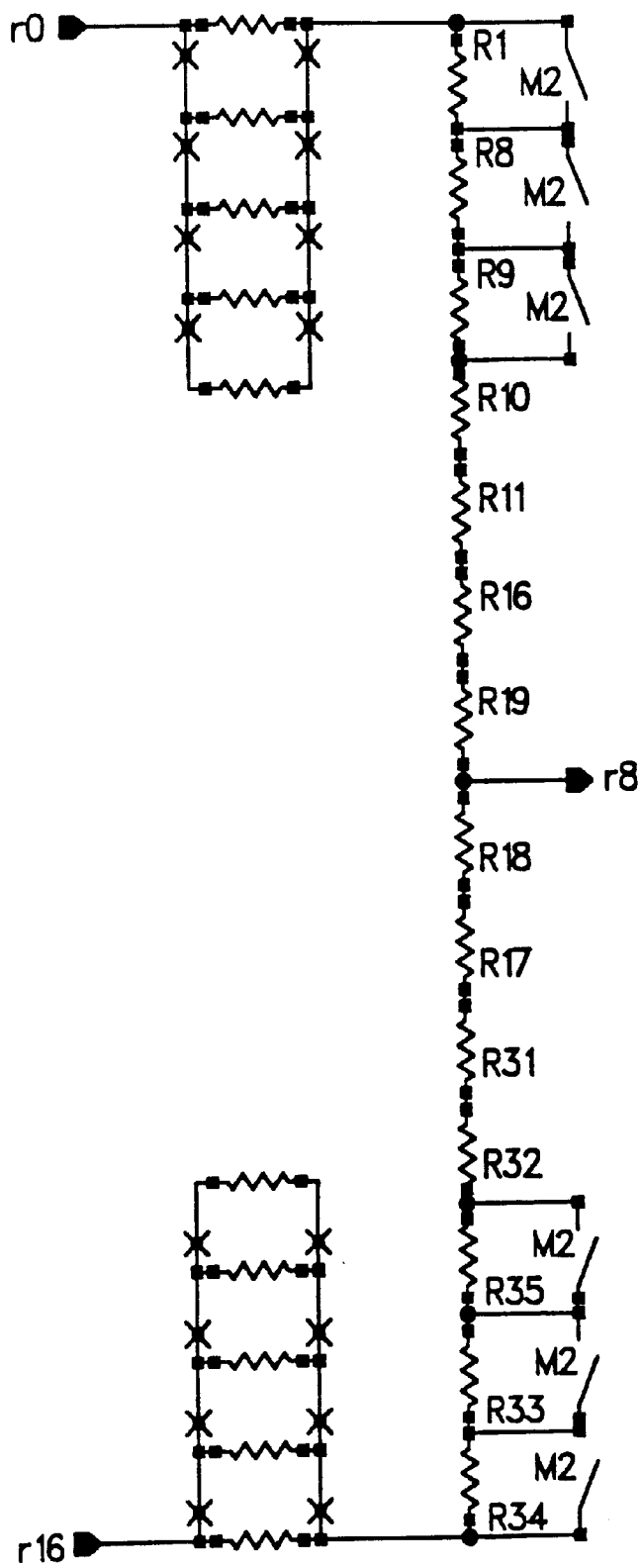
FIG. 8 shows a resistor divider implementation for gxC-CDiv0 of FIG. 5.

Connected to the voltage divider circuitry is a means for coupling the divider circuitry to the output lines to which it is attached. In one embodiment the means for coupling is simply a wire attached between the voltage divider circuitry and the output lines. In an alternate embodiment the means for coupling is composed of a CMOS pass gate which serves to isolate the voltage divider circuitry from the output lines to which it is attached when the current control circuitry is not enabled. In another embodiment the means of coupling is an NMOS pass gate with boosted gate voltages. A typical circuit to generate the boosted gate voltage level is shown in FIG. 6.

Other embodiments employ unity gain buffers, operational amplifiers, transconductance, or sample-and hold circuitry to couple the voltage at the output lines with the voltage divider. Still other embodiments employ capacitors to couple a difference voltage from the output lines to the voltage divider, such as in some switched capacitor filters.

While the above discussion referred to a resistance voltage divider, other embodiments for dividers include the use of digital to analog converters or switched capacitor filters such as a sigma/delta modulator. An analog-to-digital converter may be used to convert the analog input voltage and/or Vref values to a digital value. Subsequent division and comparison may then be performed by digital signal processing.

The output value from the voltage divider circuitry is compared to a voltage reference value. The comparator may be a simple analog differential voltage comparator shown in FIGS. 7A and 7B. In an alternate embodiment, the comparator may be a regenerative sense-amp circuit. The comparator may also be a switched capacitor filter. In still another embodiment where an analog-to-digital converter is used as a voltage divider, the comparator may be a digital signal processor.

Preferably, the reference voltage is provided from an external pin. However, the reference voltage may also be generated with a band-gap reference circuit, or a voltage divider of Vdd or another voltage supply.

Figure 5:
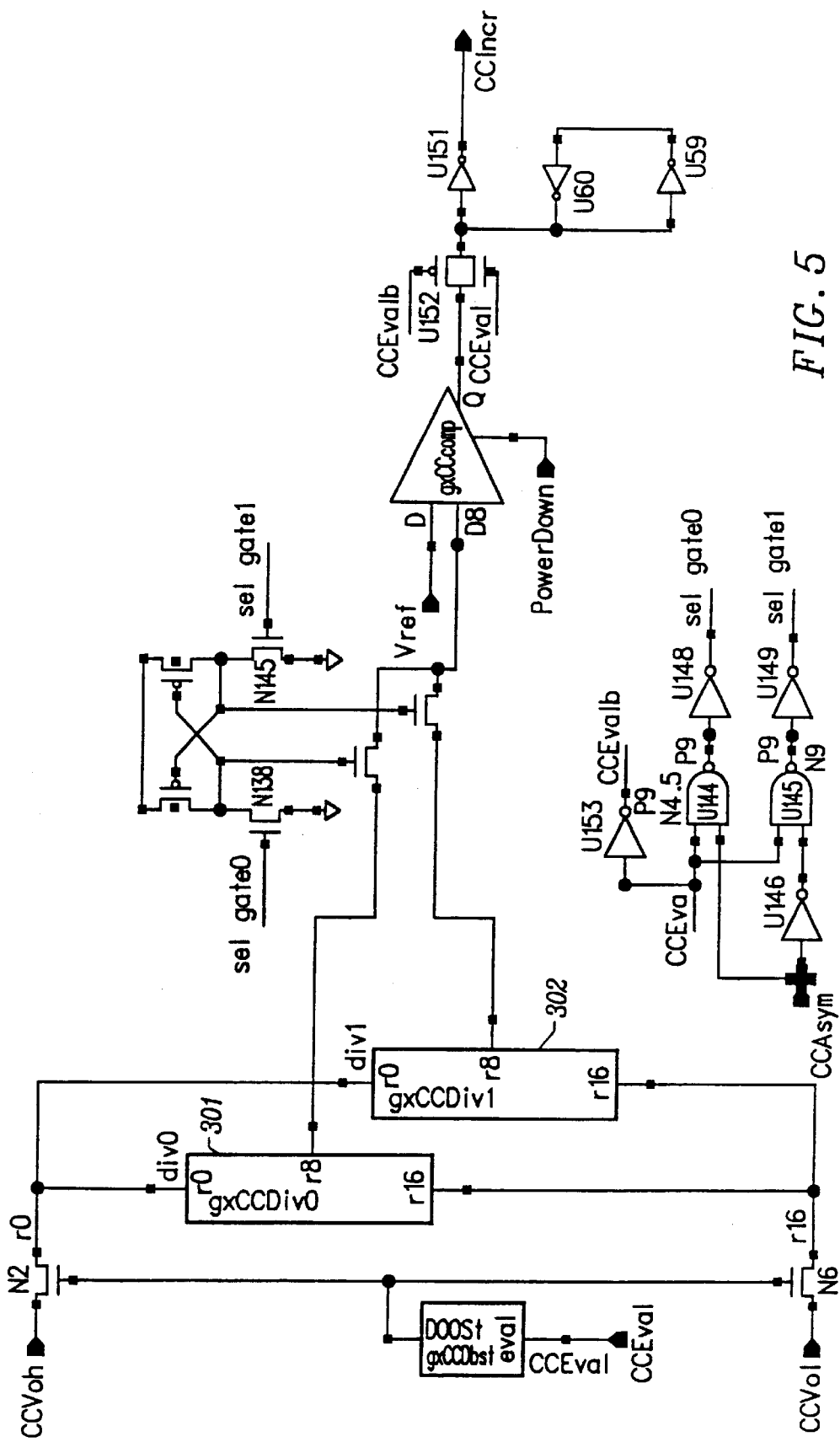
FIG. 5 is a detailed illustration of an implementation of the current control circuitry of the invention.
Figure 9:
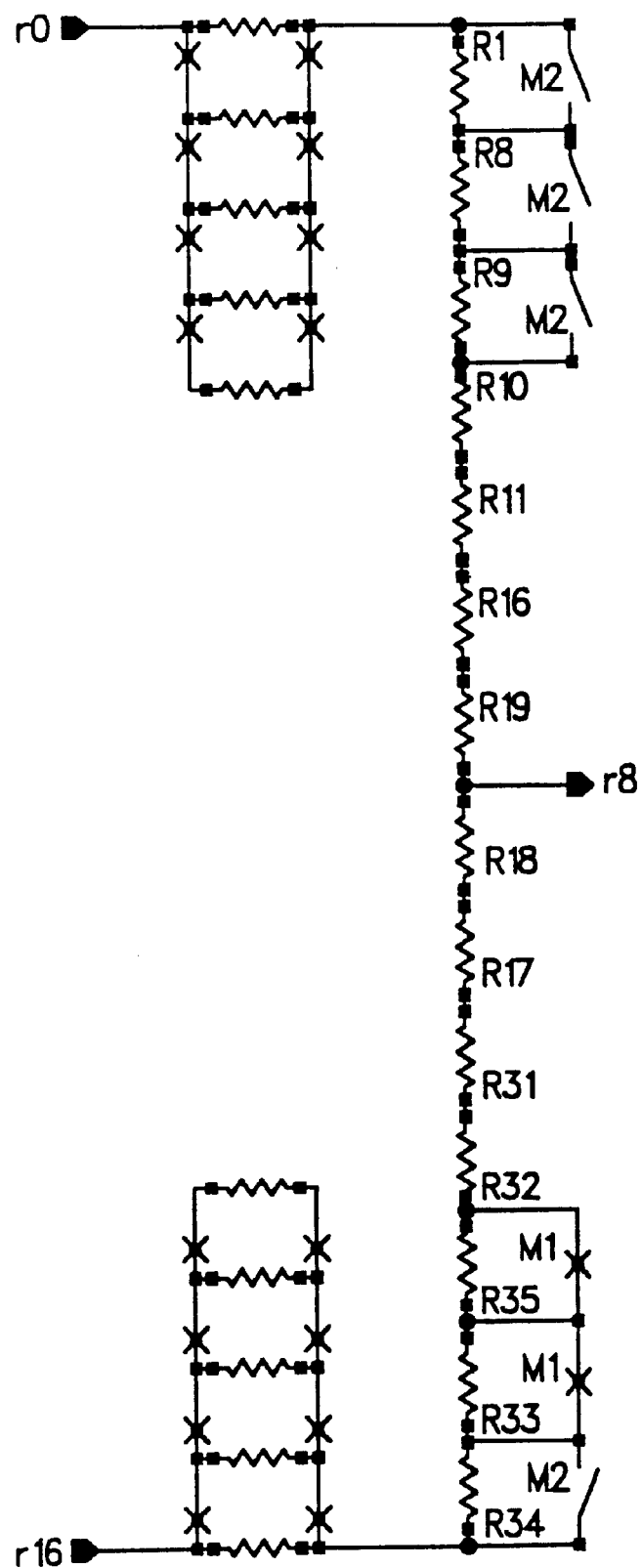
FIG. 9 shows a resistor divider implementation for gxC-CDiv1 of FIG. 5.

Preferably, two voltage divider ratios are selectable. For example, FIG. 5 illustrates two voltage divider devices 301 and 302 that may be alternately selected. The actual voltage divider circuits may be implemented resistive ladders of the type shown in FIGS. 8 and 9.

In some embodiments, a sampling latch may be employed between the output of the comparator and the up-down counter. The sampling latch functions to average the output of the comparator so that the jitter on the counter is reduced.

The invention does not require the CC pin and external resistor shown in the prior art device of FIG. 1. The invention also provides better tracking than the device of FIG. 1. For FIG. 1, a fairly complex, and somewhat unwieldy current control initialization algorithm is required to find the proper start value for each slave device. However, with the present invention, implementing the current control scheme eliminates the need for complex initializtion as each slave device automatically adjusts its own output to proper swing levels. Slave devices are instructed on a regular but infrequent basis to check the outputs. This may be accomplished during the same time a master device performs its calibration.

For the master device, the benefits of the present invention include the elimination of the CC pin and output driver and greater accuracy of setting the proper current swing. Estimates show that by implementing the current control technique of FIG. 2, an increase in voltage margin yields about 70 MHz of additional tiling margin.

Moreover, for the technique of the present invention, there is no need for current control resistors on y-channel modules. However, the technique is also backwards compatible for modules that currently have such resistors.

Furthermore, the slave device automatically adjust its swing and monitors the current to adjust for variations in output drive due to voltage and temperature variations. Also, each slave device finds its own current control value depending on the process variations of the individual component.

The benefits of the present invention for the slave device include better swing accuracy (related to a similar benefit for the master device), elimination of the existing current control tracking logic in the slave device, and elimination of the current control initialization routine described in U.S. Pat. No. 5,254,883.

For the master device, two pins are used for current control adjustment. One pin is driven to a logic one (low voltage) and the other pin is not driven. The time this is done is under control of the control logic within the ASIC. The slave device is done at the same time, using different pins (for driving) than the master device is using. During this operation, a resistive divider is inserted between two pins, using pass transistors T1 and T2. These resistors halve the voltage between them and compare against the $V_{ref}$ voltage (already present on the chip). A counter is incremented if more current is needed to increase the voltage swing or decremented if too much voltage swing is detected. Although the digital adjustment is a simple up/down counter, a more sophisticated binary search can be implemented, followed by a simple adjust one up or down once the algorithm is completed. Such an embodiment is complicated, the savings of time to find the necessary set point may not justify elimination of a simple up/down counter.

For the slave device, two pins are used for current control adjustment One pin is driven to a logic one (low voltage) and the other pin is not driven. This is done using a special register read command (or this could be done during a memory refresh to the same device). During this operation, a resistive divider is inserted between two pins, using pass transistors T3 and T4. These resistors halve the voltage between them and compare against the $V_{ref}$ voltage (already present on the chip). A counter is incremented if more current is needed to increase the voltage swing or decremented if too much voltage swing is detected. Although the digital adjustment is a simple up/down counter, a more sophisticated binary search could have been inplemented, followed by a simple adjust one up or down once the algorithm is completed.

The new method use two of the N total pins, different pins for the master and the slave. During current calibration, one slave and the master both calibrate at the same time, on different pins.

Figure 10:
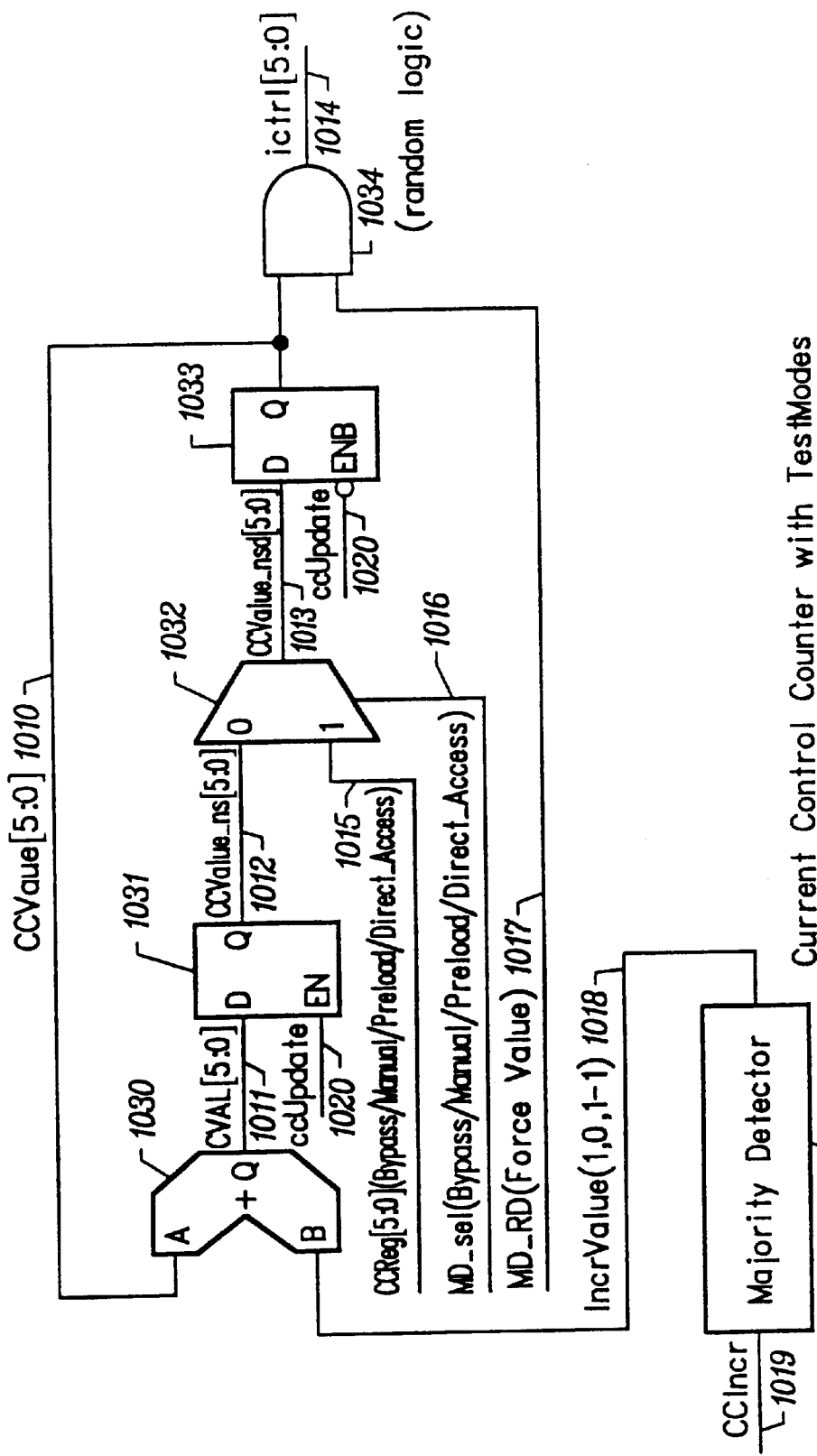
FIG. 10 illustrates control and test mode logic circuitry that may be used in accordance with an embodiment of the invention.

FIG. 10 illustrates control and test mode logic that may be used in connection with the invention. The current control counter includes an adder 1030, a master latch 1031, a multiplexer 1032, a slave latch 1033, random logic 1034, and a majority detector, 1035. Using the control counter in FIG. 10, various modes of operations are possible. In a first mode, the circuitry is placed in an "auto mode" when MD_sel Bypass 1016 is deasserted and MD_RD 1017 is asserted. In the auto mode, CCValue_ns[5:0] 1012 is coupled to CCValue_nsd[5:0] 1013. Each ccUpdate 1020 pulse updates the current control value by one bit based on the Value IncrValue 1018 (which take values of 1,0, or −1).

During initialization, a series of ccUpdate pulses will drive ictrl[5:] 1014 to approach its equilibrium value. Periodic updates may be done with subsequent ccUpdate pulses at specified intervals.

In a second mode, the circuitry is placed in a "manual mode" when MD_sel Bypass 1016 is asserted and MD_RD 1017 is asserted. In the manual mode, CCValue_nsd[5:0] 1013 is coupled to CCreg[5:0] 1015. At the low phase of ccUpdate, the value of ictrl[5:0] is loaded into CCReg[5:0] 1015. This mode may be used to drive an arbitrary ictrl[5:0] value, or to preload the master-slave flip flop (1033) before entering Auto mode. The same datapath is used during the Direct Access Test mode where test values of ictrl[S:0] are driven by changing CCReg[5:0]. A "mid" value of CCValue [5:0]=100000 may be preloaded at initialization so the equilibrium value is reached with fewer numbers of ccUpdate pulses.

The circuitry may also be placed in a "force mode" when MD_RD 1017 is deasserted. In the force mode, a specific value may be forced at ictrl[5:0] when MD_RD 1017 is de-asserted. In the preferred embodiment, random logic forces ictrl[5:0]=101111. An alternate embodiment may implement a different forced value or values. This mode is used for testing and calibration.

The majority detector filters the value of CCIncr 1019 and prevents toggling of ictrl[5:0] when the value is within one bit of the settled value. The majority detector takes an even number of samples of Signal CCIncr. The IncrValue 1018 is "1" if the majority of samples are high The IncrValue 1018 is "−1" if the majority of samples are low. The IncrValue 1018 is "0" if there is no majority.

Figure 11:
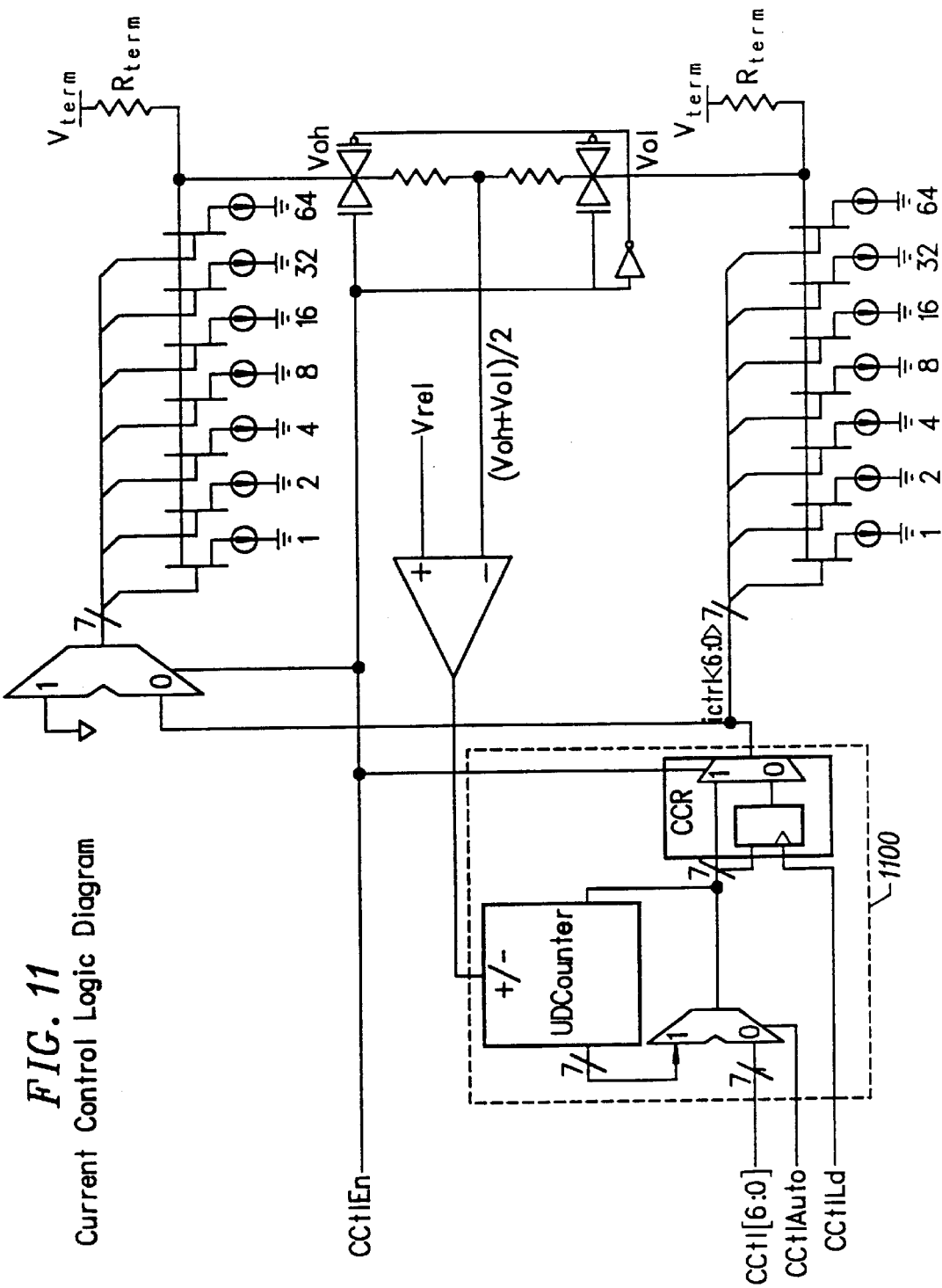
FIG. 11 illustrates a current control counter circuit that may be used in accordance with an embodiment of the invention.

FIG. 11 shows another embodiment of current control counter that may be used in accordance with the invention. This implementation uses a seven-bit ictrl value. The circuitry 1100 has three modes of operation. In a first mode, the circuitry is placed in an "auto-acquire mode" when CCtlEn is high and CCtlAuto is high. In the auto-acquire mode, the up-down counter is coupled to ictrl[6:0]. As the up-down counter is incremented or decremented, ictrl[6:0] is changed accordingly, until the equilibrium value of ictrl[6:0] is reached. At this point, the equilibrium value is loaded into CCR with signal CCtlLd, and the current control counter may enter Auto mode.

The circuitry may also be placed in an "auto mode" when CCtlEn is low and CCtlAuto is high. In the auto mode, the register in the CCR block controls the current setting of ictrl[6:0]. In this mode, the up-down counter is also coupled to the CCR register.

The circuitry also has a "manual mode" when CCtlEn is low and CCtlAuto is low. In the manual mode, a seven-bit value CCtl[6:0] is driven or stored into the counter and ictrl[6:0]. This mode is used to set a value into the counter and register that is close to the setting that will actually result in the auto-acquire mode, which cuts down on the time it takes to reach the equilibrium ictrl[6:0] value. This mode may also be used to set the counter and register to a certain value before the auto-acquire mode is entered. This mode may also be used as a test or direct access mode where specific values may be driven onto ictrl[6:0] by changing Cctl[6:0].

The current control circuitry may be implemented with a single output pin to perform current calibration. Both "high" and "low" voltage values are measured from the same pin sequentially with sample-and-hold circuitry. Subsequent processing of these voltage values are averaged with a voltage divider.

In another embodiment, the pin voltage values are measured during normal operation of the RDRAM. Based on data of the DRAM "read" operations, the current control circuitry determines when stable output "high" or "low" voltage patterns are present on the pin. A single pin or multiple pins may be used to measure the pad voltage. Multiple samples and averaging may be performed to filter noise coupling and reflection on the output channel from the stable output "high" and "low" levels. This embodiment has the advantage of requiring no "quiet period" on the channel for current control calibration.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A semiconductor memory device including an array of memory cells, wherein the memory device comprises:
    a first output driver coupled to a first output terminal;
    a second output driver coupled to a second output terminal;
    a voltage divider coupled between the first and second output terminals, to generate a control voltage based on a voltage level present on the first output terminal and a voltage level present on the second output terminal; and
    a comparator, coupled to the voltage divider, to compare the control voltage with a reference voltage, wherein an amount of voltage swing of the first output driver is adjusted based on the comparison between the control voltage and the reference voltage.

2. The memory device of claim 1 wherein the amount of voltage swing of the first output driver is adjusted during a refresh operation.

3. The memory device of claim 1 wherein the array of memory cells is a dynamic random access memory cell array.

4. The memory device of claim 1 further including a counter, coupled to the comparator, to store a value which is representative of the amount of voltage swing of the first output driver.

5. The memory device of claim 1 further including a latch coupled to the comparator, to sample information that is representative of the comparison between the control voltage and the reference voltage.

6. The memory device of claim 1 wherein:
    the first output driver is activated to sink an amount of current corresponding to the amount of voltage swing; and
    the second output driver is deactivated when the first output driver is activated.

7. The memory device of claim 1 wherein the voltage level present on the second output terminal is provided via a resistor.

8. The memory device of claim 7 wherein the resistor is coupled between the second output terminal and a voltage supply node.

9. The memory device of claim 8 wherein:
    the resistor is a termination resistor which is external to the memory device; and
    the voltage supply node is external to the memory device.

10. The memory device of claim 1 wherein the first output driver includes a plurality of transistors, wherein each transistor of the plurality of transistors is coupled between a voltage supply node and the first output terminal.

11. The memory device of claim 10 further including a counter, coupled to the plurality of transistors, to hold a code that is representative of which transistors of the plurality of transistors to activate, wherein the amount of voltage swing is dependent on which transistors of the plurality of transistors are activated.

12. The memory device of claim 1 further including an isolation circuit, coupled between the voltage divider and the first output terminal, to selectively isolate the voltage divider from the first output terminal.

13. The memory device of claim 1 wherein the voltage divider includes:
    a plurality of resistors; and
    a plurality of switches coupled among the plurality of resistors to set a divider ratio.

14. A semiconductor memory device including an array of memory cells, wherein the memory device comprises:
    a first output driver circuit to produce an amount of voltage swing on a first external signal line via a first terminal;
    a voltage divider circuit, coupled to the first terminal, to generate a control voltage based on the amount of voltage swing produced by the first output driver; and
    a comparator circuit coupled to the voltage divider circuit, to compare the control voltage with a reference voltage, wherein, the amount of voltage swing produced by the first output driver is adjusted in response to the comparison between the control voltage and the reference voltage.

15. The memory device of claim 14 further including a second terminal, coupled to the voltage divider circuit, wherein the voltage divider circuit is coupled between the first and second terminals, the voltage divider circuit to generate the control voltage based on a ratio between a voltage level present on the second terminal and a voltage level present on the first terminal, wherein the voltage level present on the first terminal is based on the amount of voltage swing produced by the first output driver.

16. The memory device of claim 15 further including an external resistor coupled to the second terminal.

17. The memory device of claim 16 further including a second output driver coupled to the second terminal, and wherein the external resistor is coupled to the second terminal via a second external signal line.

18. The memory device of claim 14 further including a counter circuit, coupled to the comparator circuit, to hold a value which is representative of the amount of voltage swing of the first output driver.

19. The memory device of claim 14 further including a latch circuit, coupled to the comparator circuit, to sample information representative of the comparison between the control voltage and the reference voltage.

20. The memory device of claim 14 wherein the amount of voltage swing of the first output driver is adjusted during a read operation.

21. The memory device of claim 14 wherein the first output driver circuit includes a plurality of transistors, wherein each transistor of the plurality of transistors is coupled between a voltage supply node and the first terminal.

22. The memory device of claim 21 further including a counter circuit, coupled to the plurality of transistors, to hold a code that is representative of which transistors of the plurality of transistors to activate, wherein the amount of voltage swing is dependent on which transistors of the plurality of transistors are activated.

23. The memory device of claim 14 further including an isolation circuit, coupled between the voltage divider circuit and the first terminal, to selectively isolate the voltage divider circuit from the first terminal.

24. The memory device of claim 14 wherein the voltage divider circuit includes:
    a plurality of resistors; and
    a plurality of switches coupled among the plurality of resistors to set a divider ratio.

25. The memory device of claim 14 wherein the reference voltage is provided from a source external to the memory device via a reference voltage terminal.

26. The memory device of claim 14 wherein the reference voltage is generated internally by an internal reference voltage generator.

27. The memory device of claim 14 wherein the comparator circuit includes an analog differential comparator circuit.

28. The memory device of claim 14 wherein the voltage divider circuit includes an analog to digital converter.

29. The memory device of claim 14 wherein the voltage divider circuit includes a switched capacitor filter.

30. The memory device of claim 14 wherein the voltage divider circuit supports a plurality of selectable voltage divider ratios.

31. A method of operation in a semiconductor memory device wherein the memory device includes an array of memory cells and a voltage divider coupled to a first output driver, the method comprises;

driving, from an output terminal coupled to the first-output driver, a first voltage level onto an external signal line to produce an amount-of voltage swing on the external signal line;

generating a control voltage using the voltage divider, wherein the control voltage is based on the amount of voltage swing;

comparing the control voltage with a reference voltage; and adjusting the amount of voltage swing produced by the first output driver based on the comparison between the control voltage and the reference voltage.

32. The method of claim 31 wherein the amount of voltage swing of the first output driver is adjusted during a refresh operation.

33. The method of claim 31 wherein the amount of voltage swing of the first output driver is adjusted during a read operation.

34. The method of claim 31 wherein the amount of voltage swing produced by the first output driver is represented by a code held in a counter circuit, the method further including:

adjusting the code in a first direction when the control voltage is greater than the reference voltage; and adjusting the code in a second direction when the control voltage is less than the reference voltage.

35. The method of claim 34 wherein the first output driver circuit includes a plurality of transistors, wherein adjusting the amount of voltage swing produced by the first output driver based on the comparison includes activating a number of transistors of the plurality of transistors, wherein the number of transistors activated is determined by the code held in the counter circuit.

36. The method of claim 31 wherein the first output driver includes a plurality of transistors, wherein adjusting the amount of voltage swing produced by the first output driver based on the comparison includes activating a number of transistors of the plurality of transistors, wherein the number of transistors activated is determined by the comparison between the control voltage and the reference voltage.

37. The method of claim 31 further including isolating the output terminal coupled to the first output driver from the voltage divider after adjusting the amount of voltage swing of the first output driver.

38. The method of claim 31 further including receiving the reference voltage from a source external to the memory device.

39. The method of claim 31 further including generating the reference voltage using an internal voltage generator.

40. The method of claim 31 wherein the control voltage is based on a ratio between the first voltage level and a second voltage level.

41. The method of claim 31 wherein the array of memory cells include dynamic random access memory cells.

* * * * *